(12) United States Patent
Okamura

(10) Patent No.: US 6,462,512 B2
(45) Date of Patent: Oct. 8, 2002

(54) CAPACITOR STORAGE SYSTEM

(75) Inventor: Michio Okamura, Kanagawa (JP)

(73) Assignees: JEOL Ltd., Tokyo (JP); Okamura Laboratory, Inc., Kanagawa (JP); Kabushiki Kaisha Powersystems, Kanagawa (JP)

( * ) Notice: Subject to any disclaimer, the term of this patent is extended or adjusted under 35 U.S.C. 154(b) by 0 days.

(21) Appl. No.: 10/002,958

(22) Filed: Nov. 1, 2001

(65) Prior Publication Data

US 2002/0094623 A1 Jul. 18, 2002

(30) Foreign Application Priority Data

Nov. 1, 2000 (JP) ........................................ 2000-334415

(51) Int. Cl.[7] .............................................. H01M 10/46
(52) U.S. Cl. ........................................ 320/122; 320/166
(58) Field of Search ................................. 320/116, 118, 320/120, 122, 166, 167

(56) References Cited

U.S. PATENT DOCUMENTS

| | | | |
|---|---|---|---|
| 5,528,121 A | | 6/1996 | Okamura |
| 5,675,233 A | * | 10/1997 | Kaneko et al. ............. 320/122 |
| 5,726,552 A | | 3/1998 | Okamura |
| 5,850,136 A | * | 12/1998 | Kaneko ................. 320/122 X |
| 5,932,990 A | * | 8/1999 | Kaneko ....................... 320/122 |
| 5,969,505 A | | 10/1999 | Okamura ..................... 320/122 |

* cited by examiner

Primary Examiner—Edward H. Tso
(74) Attorney, Agent, or Firm—Webb Ziesenheim Logsdon Orkin & Hanson, P.C.

(57) ABSTRACT

A capacitor storage system is provided which is simple in structure and can control the charge level according to the use environment and detect a fault, if any. The capacitor storage system comprises: a plurality of capacitors connected in series and producing terminal voltages, respectively, the capacitors developing a total voltage, parallel monitors connected with the capacitors, respectively, for monitoring terminal voltages of the capacitors and for initializing the capacitors, a charging controller for controlling charging of the series-connected capacitors according to the total voltage of the series-connected capacitors, and a charging stop total voltage setter for setting a charging stop total voltage Vm, wherein each of the parallel monitors having a comparator for detecting a predetermined initialization voltage Vini and a bypass circuit for bypassing a charging current of the corresponding capacitor, the bypass circuit receiving an output from the comparator as its control input, the charging controller enables the parallel monitors to perform an operation of initialization, if the initialization voltage is detected from any one of the capacitors, and then stops charging of the series-connected capacitors when the total voltage of the series-connected capacitors reaches the charging stop total voltage Vm.

7 Claims, 4 Drawing Sheets

ONE OR MORE ADDITIONAL
CAPACITORS C CONNECTED
IN SERIES

ONE OR MORE ADDITIONAL
CAPACITORS C CONNECTED
IN SERIES

US 6,462,512 B2

CAPACITOR STORAGE SYSTEM

BACKGROUND OF THE INVENTION

1. Field of the Invention

The present invention relates to a capacitor storage system, which consists of plural capacitors and with which parallel monitors are connected to monitor the terminal voltages of the respective capacitors and to initialize the capacitors.

2. Description of the Related Art

Where plural capacitors of large capacity are combined to build an electrical storage system, load voltages must be made uniform. This problem occurs when the capacitors are connected in series. We have already proposed an electrical storage system, termed an ECS (energy capacitor system), using electric double-layer capacitors (see, for example, Japanese patent laid-open No. 371996/1999) combined with an electronic circuit. In the ECS, a parallel monitor connected with each series-connected capacitor acts as a voltage-monitoring controller and detects the terminal voltage for initialization and the full charge level. The parallel monitor enables maximum charging within the withstand voltage of each capacitor.

FIG. 5 shows a conventional example of the capacitor storage system equipped with parallel monitors. This system has a charger 11, as well as the parallel monitors. The system further includes comparators 12 and 13, OR gates 14 and 15, a capacitor C, a resistor R, a transistor Tr, and a switch S1 for initialization. A reference voltage Vful is set to the full charge voltage of the capacitor, and another reference voltage Vini is set to an initialization voltage which is lower than the reference voltage Vful. A required number of capacitors (not shown in FIG. 5) similar to the capacitor C are connected in series below. Each capacitor has the same parallel monitor as the parallel monitor shown in FIG. 5.

As shown in FIG. 5, the conventional parallel monitor has the separate comparators 12 and 13 for detection of the initialization voltage and the full charge voltage, respectively. The comparator 12 compares the voltage across the capacitor C with the initialization voltage Vini, judges whether the voltage across the capacitor C reaches the initialization voltage Vini, and produces a monitor signal I indicative of detection of the initialization voltage. During operation of initializing charging, the comparator 12 controls the transistor Tr connected in parallel with the capacitor C to bypass the charging current. In this way, the charge levels of capacitors are made uniform.

The switch SI for initialization is used to enable and disable initialization of the capacitor C in response to the initialization control signal S. When an initialization mode is selected, the initialization switch S1 is closed. During initializing charging, if the voltage developed across the capacitor C reaches the initialization voltage Vini, the transistor Tr is turned on, thus forming a bypass circuit for the charging current. In this way, the charging current is limited. This charging current is set by the resistor R.

The comparator 13 is used as a voltage detection means for detecting that the full charge level is reached. The comparator 13 compares the voltage developed across the capacitor C with the full charge voltage Vful that is higher than the initialization voltage Vini and produces a monitor signal F indicative of detection of the full charge level. The charger 11 controls the charging according to this monitor signal F.

The output signals I from the comparator 12 and similar comparators (not shown) indicating detection of initialization voltage are ORed by the OR gate 14. The output signals F from the comparator 13 and similar comparators (not shown) indicating detection of the full charge level are ORed by the OR gate 15. The charger 11 charges the plural capacitors (including the shown capacitor C) connected in series, and makes various decisions regarding execution of operation for initializing, stopping of charging operation, and so on in response to the output signals from the OR gates 14 and 15.

For example, when initializing charging is done, the charger 11 closes the initialization switch S1 in response to the initialization control signal S. The charger 11 ORs the output signals I from the comparators such as 12 for their respective capacitors indicative of detection of initialization voltage, using the OR gate 14. Thus, the charger judges that a bypass operation is started at one of the capacitors. The charger 11 ORs the output signals F from the comparators 13 for their respective capacitors indicative of the full charge level, using the OR gate 15. Hence, the charger can end storage charging after judging one of the capacitors has reached the fill charge.

Accordingly, during charging, if the initialization voltage Vini is set lower than the full charge setting voltage Vful, and if the initialization switch S1 is closed, the transistors, such as Tr, are successively turned on by the capacitors which are charged up to the initialization voltage Vini. The bypass circuit formed by the transistor and the resistor R bypasses a part of the charging current. This lowers the charging rate. As the charging process progresses and any one of the capacitors reaches the full charge setting voltage, the charger 11 stops the charging of a constant current. If necessary, relaxation charging is done.

In the above-described structure, each parallel monitor needs two comparators for detection of the initialization voltage Vini and for detection of full charge setting voltage Vful, respectively. This has complicated the configuration.

SUMMARY OF THE INVENTION

It is an object of the present invention to provide a capacitor storage system that is simple in structure, is capable of controlling charge levels according to the use environment, and is able to detect a fault, if any.

This object is achieved in accordance with the teachings of the present invention by a capacitor storage system comprising: a plurality of capacitors connected in series and producing terminal voltages, respectively, the capacitors developing a total voltage; parallel monitors connected with the capacitors, respectively, for monitoring terminal voltages of the capacitors and for initializing the capacitors; a charging control means for controlling charging of the series-connected capacitors according to the total voltage of the series-connected capacitors; and a charging stop total voltage-setting means for setting a charging stop total voltage Vm. Each of the parallel monitors has a comparator for detecting a predetermined initialization voltage Vini and a bypass circuit for bypassing a charging current of the corresponding capacitor, the bypass circuit receiving an output from the comparator as its control input. The charging control means enables the parallel monitors to perform an operation of initialization, if the initialization voltage is detected from any one of the capacitors, and then stops charging of the series-connected capacitors when the total voltage of the series-connected capacitors reaches the charging stop total voltage Vm.

In the capacitor storage system in accordance with the present invention, the charging control means can enable the parallel monitors to perform an operation of initialization for a given time, and the charging stop total voltage-setting means can set a charging stop total voltage Vm according to the total voltage obtained after the aforementioned given time or when the initialization voltage is detected.

In the capacitor storage system in accordance with the present invention, the charging stop total voltage-setting means can find the charging stop total voltage Vm by multiplying the total voltage Vxit, which is detected either after the operation of initialization is performed for the aforementioned given time or when the initialization voltage is detected, by the ratio of the full charge voltage Vful of each capacitor to the initialization voltage Vini.

In the capacitor storage system in accordance with the present invention, each of the parallel monitors can have a second capacitor for detecting a voltage higher than the capacitor's maximum rated voltage and a third comparator for detecting a voltage close to zero voltage, and the charging control means detects a fault, if any, according to signals from the second and third comparators, and controls charging.

Furthermore, the capacitor storage system in accordance with the present invention can be equipped with means for detecting the temperatures of the capacitors or their vicinities. The charging stop voltage-setting means may increase the full charge voltage Vful for finding the charging stop voltage as the detected temperature drops.

In the capacitor storage system in accordance with the present invention, the charging control means may set the fill charge voltage Vful according to a specified amount of stored charge.

Other objects and features of the present invention will appear in the course of the description thereof, which follows.

BRIEF DESCRIPTION OF THE DRAWINGS

FIG. 1($b$) is a circuit diagram of the capacitor electrical storage portion shown in FIG. 1($a$);

DESCRIPTION OF THE PREFERRED EMBODIMENTS

Figure 1A:
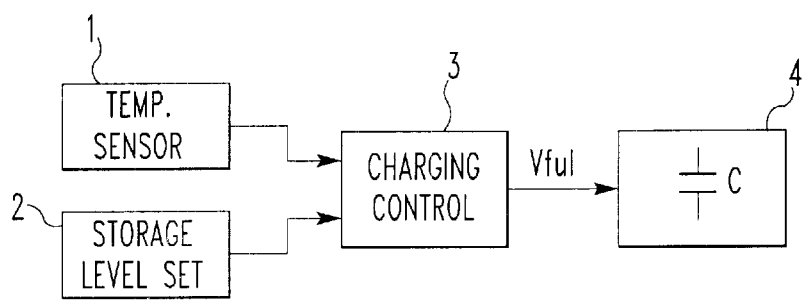
FIG. 1($a$) is a block diagram of a capacitor storage system in accordance with the present invention.

Referring to FIGS. 1($a$) and 1($b$), a capacitor storage system has a temperature sensor 1, a storage level setting portion 2, a charging control portion 3, a capacitor electrical storage portion 4, a charger 11, a comparator 12, an OR gate 14, a capacitor C, a resistor R, and a transistor T.

In FIG. 1($a$), the temperature sensor 1 detects the temperature of the environment around the electrical storage system. The storage level setting portion 2 sets an amount of electric charge that the storage system is required to store. The charging control portion 3 calculates full charge level, using the environment temperature detected by the temperature sensor 1 and the amount of electric charge required by the storage level setting portion 2. The charging control portion 3 controls the capacitor electrical storage portion 4 to the calculated full charge level. If the environment temperature drops to a low temperature, the charging control portion 3 calculates a higher full charge level according to the temperature range. The capacitor electrical storage portion 4 comprises a plurality of capacitors C (only one is shown) connected in series to store electric energy. The capacitor electrical storage portion 4 releases the stored energy and supplies it to a load.

In the above-described capacitor storage system in accordance with the present invention, full charge total voltage Vm is calculated from the total voltage Vxit developed when initializing charging is performed during a given period and from full charge voltage Vful set according to the use environment, using the output signal I from the comparator 12 indicative of detection of the initialization voltage as shown in FIG. 1($b$). The charging process is controlled according to this full charge total voltage Vm.

In an example of setting of voltage of each parallel monitor, the resetting voltage Vini is 2.2 V. The full charge voltage Vful is 2.2 V, which is equal to the resetting voltage Vini. Cases where the full charge voltage is 2.5 V, 2.75 V, and 3.0 V, respectively, are also described.

Figure 2:
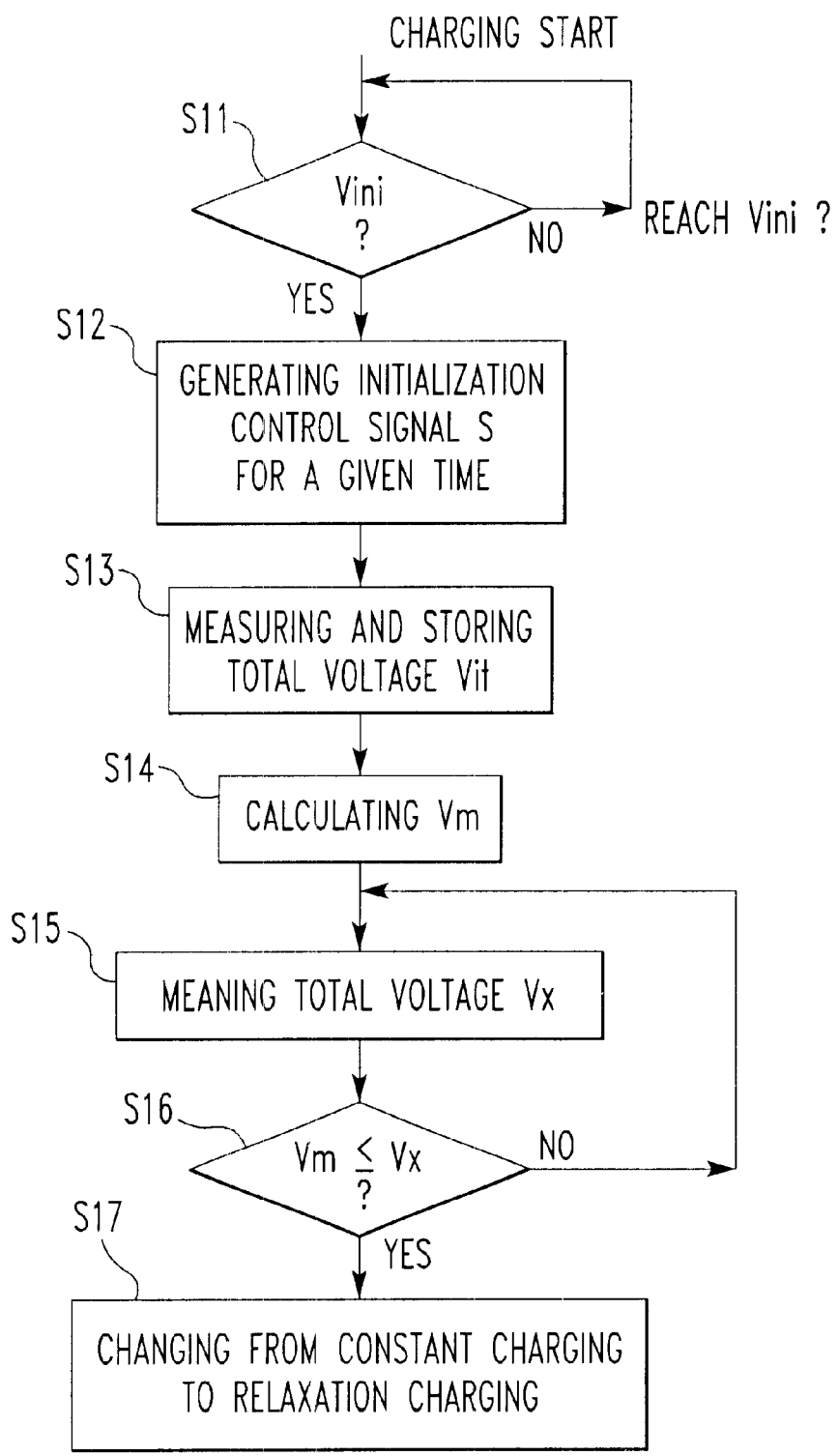
FIG. 2 is a flowchart illustrating a control sequence for charging and initializing in the capacitor storage system shown in FIG. 1($a$)

The sequences for charging and initializing are illustrated in FIG. 2. During the charging process, if the terminal voltage of any one of the capacitors, such as C, connected in series reaches the initialization voltage Vini (step S11), the comparator 12 detects it. The output signal I from the comparator 12 indicative of detection of the initialization voltage is sent as a monitor signal to the charger 11.

The charger 11 then generates initialization control signal S for a given time of tp (e.g., 5 seconds) (step S12). Then, the total voltage Vxit of the series combination of the capacitors is measured, and the results are stored in memory (step S13). Full charge total voltage Vm at which the charging is to be stopped is calculated using Eq. (1) (step S14).

$$Vm = Vxit(Vful/Vini) \qquad (1)$$

According to this equation, where the full charge voltage Vful of one cell is 3.0 V and the initialization voltage Vini is 2.2 V, the full charge total voltage is given by Vm=Vxit× (3.0 V/2.2 V). The full charge voltage Vful of Eq. (1) above is applied to the charger 11 from the charging control portion 3. The charging control portion 3 determines the full charge voltage Vful based on information (e.g., the temperature of the environment around the capacitor) about the temperature of the capacitor obtained from the temperature sensor 1, and applies the voltage to the charger 11. One example of the relation between the temperature and the full charge voltage is that the full charge voltage Vful is increased as the temperature drops.

The charging control portion 3 also determines the full charge voltage Vful according to information about a request for electrical storage from the storage level setting portion 2. In this case, the relation is such that the full charge voltage Vful is increased as the request for electrical storage increases.

The full charge total voltage Vm calculated using Eq. (1) in this way is used as a target value. The total voltage Vx is measured (step S15). A decision is made as to whether the full charge total voltage Vm is equal to or smaller than the total voltage Vx (i.e., Vm≦ . . . Vx) (step S16). Charging is done until the measured total voltage Vx reaches the target value, or full charge total voltage Vm. Then, the charge mode is switched from constant current charging to constant voltage charging (relaxation charging). This relaxation charging is continued until the next discharge starts or a given period elapses (step S17).

Figure 3:
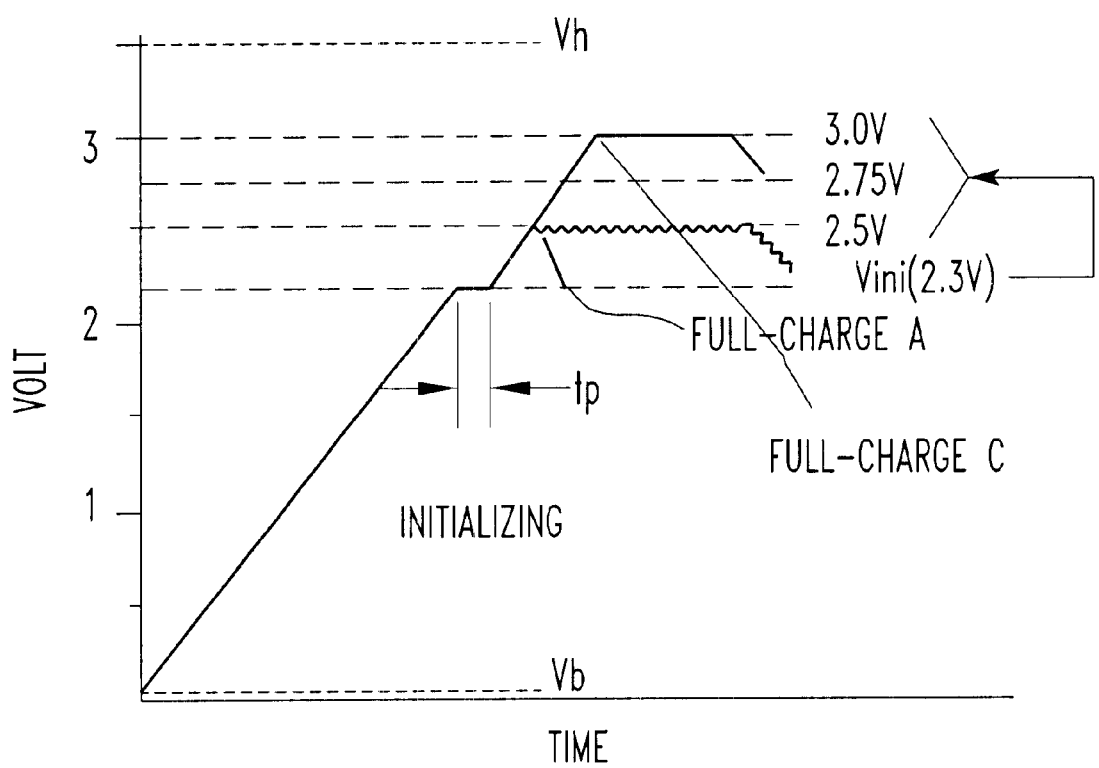
FIG. 3 is a diagram illustrating variations in the terminal voltage of each capacitor in the capacitor storage system shown in FIG. 1($a$)

FIG. 3 shows variations in the terminal voltage of one capacitor as it is charged as described above. Initializing charging is done during a given period tp from the instant when the terminal voltage of any one of the capacitors connected in series reaches the initialization voltage Vini(= 2.2 V). Then, normal charging for energy storage is done, and the terminal voltage rises. This normal charging is stopped when the terminal voltage of any one of the capacitors reaches 3.0 V where the full charge voltage of the cell is 3.0 V. Then, relaxation charging is started. In practice, when the total voltage of the series combination of the capacitors reaches Vm, the normal charging is stopped. In the example of FIG. 3, the terminal voltages of the individual capacitors are uniform.

It is assumed that the above-described full charge voltage is set to a high value of 3.0 V to prevent the amount of charge from decreasing due to a drop in the capacitance at a very cold temperature of −20° C., for example. Under ordinary temperature conditions from 20° C. to 30° C., the rated capacitance is obtained. Therefore, the full charge voltage Vful applied to the charger 11 from the charging control portion 3 is set to a value lower than 3.0 V, say 2.5 V. Under high temperature conditions (e.g., in excess of 50° C.), the full charge voltage Vful is set to a lower value (e.g., 2.2 V) to prevent destruction of the capacitor due to such high temperature. Furthermore, the full charge voltage Vful is also determined at the request for electrical storage from the storage level setting portion 2 as mentioned previously. In this case, the relation between the storage level and the full charge voltage is so set that the full charge voltage Vful is increased as the request for electrical storage increases.

Obviously, the charger 11 is so controlled that it finds the total voltage Vm based on Eq. (1), irrespective of the value to which the full charge voltage Vful is set, and that the charging is stopped when the total voltage of the series combination of the capacitors reaches this total voltage Vm.

As described thus far, the capacitor can be safely charged to an arbitrary voltage higher than the initialization voltage Vini, by setting the total voltage Vm according to the given full charge voltage Vful. Preferably, the system is interlocked according to the purpose. For example, in a hybrid vehicle, further initializing charging is not permitted if (a) the mode of operation is switched from charging to discharging, (b) large-current charging is started as a result of regenerative braking, or (c) the system is waiting for 30 seconds after the end of initializing charging to prevent hunting.

The operation of initializing charging is performed when the terminal voltage of the capacitor reaches the initialization voltage Vini. If the full charge voltage is set to a higher value, there is a chance to perform an initializing operation on every recharge cycle. Therefore, variations in terminal voltage between capacitor cells can be gradually reduced while the capacitors are charged and discharged repeatedly.

A decision is made as follows as to whether the initializing charging has been completely done or the capacitors vary widely in terminal voltage. Let n be the number of cells connected in series. The product of the resetting voltage Vini and the number of cells n is compared with the total voltage Vxit that is detected based on the output signal I indicative of detection of the initialization voltage produced when the voltage across any one of the cells reaches the voltage Vini. If the initialization is complete, it follows that the voltages across all the cells have reached the initialization voltage Vini. Therefore, the proportion of the initializing operation is p=Vxit/(n×Vini)=100%. If cells whose voltages are lower than the initialization voltage Vini are contained, the proportion p decreases accordingly.

Figure 4:
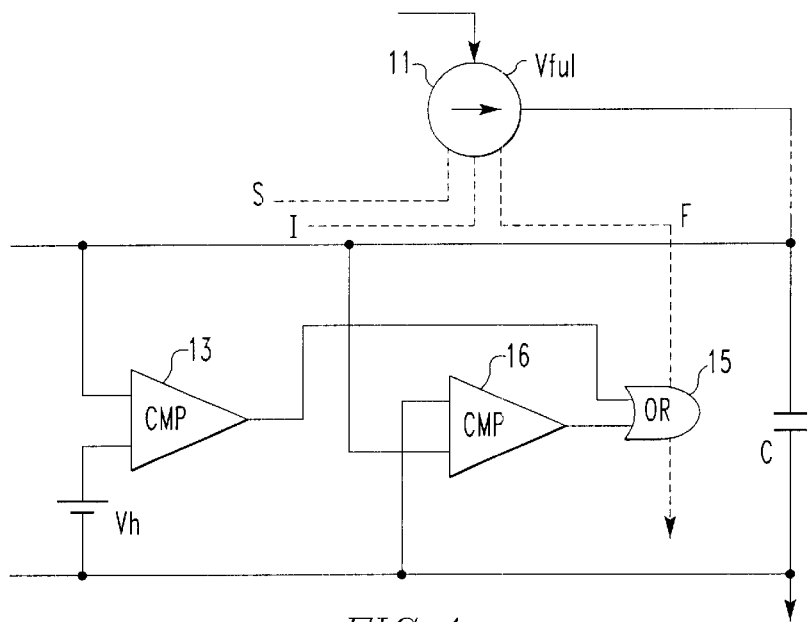
FIG. 4 is a circuit diagram of another capacitor storage system in accordance with the present invention.
Figure 5:
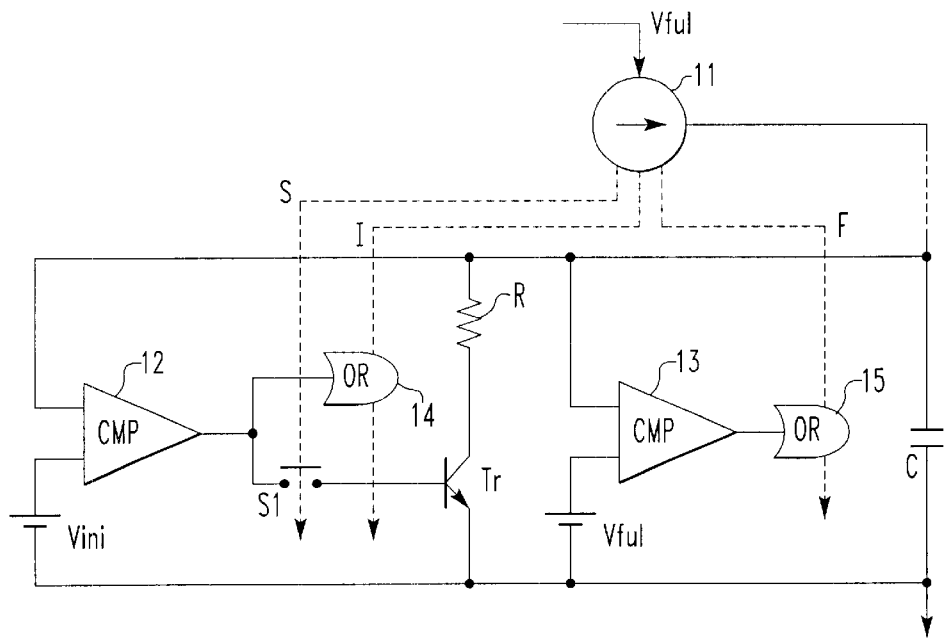
FIG. 5 is a circuit diagram of a conventional capacitor storage system equipped with parallel monitors.

Another embodiment of the invention combined with a fault detection circuit is next described. FIG. 4 shows another capacitor storage system in accordance with the present invention. The system has comparators 13, 16 and an OR gate 15.

Figure 1B:
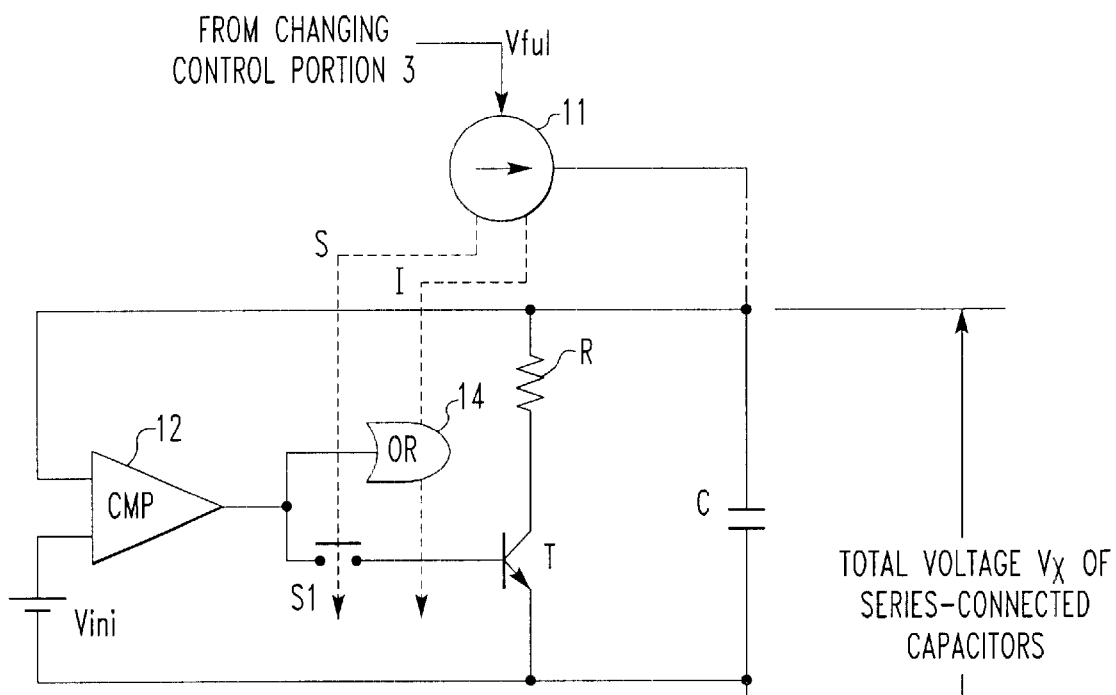

Referring to FIG. 4, a charger 11 receives an output signal I from the comparator 12 and produces an initialization control signal S. The output signal I from the comparator 12 indicates detection of the initialization voltage as shown in FIG. 1(b). The charger 11 also receives a signal F indicative of a fault. The comparator 13 is similar to the prior art comparator used to detect the full charge level. Instead of the full charge setting voltage Vful, a voltage Vh (FIG. 3) that is higher than the capacitor's maximum rated voltage is set. The comparator 16 has a detection level set to Vb (FIG. 3) around 0 V. That is, if the voltage of any one of the capacitor cells reaches the higher voltage Vh or the lower voltage Vb, the output F indicative of a fault is produced.

As indicated by broken lines in FIG. 3, the voltage Vh is set higher than the capacitor's maximum rated voltage, while the voltage Vb is set close to zero voltage. Therefore, as long as the operation is normal, the operation is prevented from getting out of the range set in this way. If the output signal F indicative of detection of a fault is received, it follows that an abnormal state lying outside the range delineated by the voltages Vh and Vb has taken place. It is during a charging process when the higher voltage Vh is exceeded and the comparator 13 produces the output signal F indicative of detection of a fault. It is during a discharging process when the lower voltage Vb is reached and the comparator 16 produces the output signal F indicative of detection of a fault. Consequently, independent conducting lines are not necessary. Hence, as shown in FIG. 4, the OR gate 15 can be used without taking the outputs from the comparators 13 and 16 independently. This simplifies the configuration of the parallel monitors.

It is to be noted that the present invention is not limited to the above-described embodiments and that various changes and modifications are possible. For example, the bank switching method already proposed by us in U.S. Pat. No. 5,734,205, which incorporated herein by reference, may be used in combination. The full charge total voltage Vm may be used as the reference voltage in determining the threshold value for bank switching. In this case, the full charge total voltage Vm is not always constant but it varies according to the state achieved by the initializing operation. Therefore, the voltage used for bank switching may be found based on the full charge total voltage Vm at all times.

As described thus far, a capacitor storage system in accordance with the present invention comprises: a plurality of capacitors connected in series and producing terminal voltages, respectively, the capacitors developing a total voltage; parallel monitors connected with the capacitors, respectively, for monitoring the terminal voltages of the capacitors and for making uniform charge levels in the capacitors; and a charging control means for controlling charging according to the total voltage of the capacitors connected in series. Each of the parallel monitors has a comparator for detecting a predetermined initialization voltage Vini and a bypass circuit for the corresponding capacitor. The bypass circuit receives the output from the comparator as its control input. The charging control means enables the control input for a given time if the initialization voltage is detected from any one of the capacitors. Then, the charging control means performs an initializing operation, and sets a charging stop total voltage Vm according to the total voltage obtained after the aforementioned given time. Therefore, the full charge voltage is varied depending on the temperature around the capacitors or on the use environment that is dependent on the setting of the required amount of charge. At very cold temperatures or in cold districts, the full charge voltage is increased to prevent the capacity from decreasing. In very hot districts, the full charge voltage is lowered to prevent deterioration.

Having thus described my invention with the detail and particularity required by the Patent Laws, what is desired protected by Letters Patent is set forth in the following claims.

What is claimed is:

1. A capacitor storage system comprising:

a plurality of capacitors connected in series and producing terminal voltages, respectively, the capacitors developing a total voltage Vx;

parallel monitors connected with the capacitors, respectively, for monitoring terminal voltages of the capacitors and for initializing the capacitors;

a charging control means for controlling charging of the series-connected capacitors according to the total voltage of the series-connected capacitors; and a charging stop total voltage-setting means for setting a charging stop total voltage Vm;

wherein each of the parallel monitors has a comparator for detecting a predetermined initialization voltage Vini of the corresponding capacitor and a bypass circuit for bypassing a charging current of the corresponding capacitor, the bypass circuit receiving an output from the comparator as its control input; and the charging control means enables the parallel monitors to perform an operation of initialization, if the initialization voltage Vini is detected from any one of the capacitors, and then stops charging of the series-connected capacitors when the total voltage Vx of the series-connected capacitors reaches the charging stop total voltage Vm.

2. The capacitor storage system of claim 1, wherein the charging control means enables the parallel monitors to perform an operation of initialization for a given time, and the charging stop total voltage-setting means sets the charging stop total voltage Vm according to a total initialization voltage Vxit obtained after the aforementioned given time or when the initialization voltage Vini is detected.

3. The capacitor storage system of claim 2, wherein the charging stop total voltage-setting means finds the charging stop total voltage Vm by multiplying the total initialization voltage Vxit, which is detected either after the operation of initialization is performed for the aforementioned given time or when the initialization voltage is detected, by the ratio of a full charge voltage Vful of each capacitor to the initialization voltage Vini.

4. The capacitor storage system of claim 2, wherein each of the parallel monitors has a second comparator for detecting a voltage higher than the capacitor's maximum rated voltage and a third comparator for detecting a voltage close to zero voltage, and wherein the charging control means detects a fault, if any, according to signals from the second and third comparators, and controls charging.

5. The capacitor storage system of claim 3, further including means for detecting the temperature of each capacitor or its vicinity, and wherein the charging stop voltage-setting means increases the full charge voltage Vful for finding the charging stop total voltage Vm as the detected temperature drops.

6. The capacitor storage system of claim 3, wherein the charging stop voltage-setting means sets the full charge voltage Vful for finding the charging stop voltage according to a specified amount of stored electric charge.

7. The capacitor storage system of claim 3, wherein each of the parallel monitors has a second comparator for detecting a voltage higher than the capacitor's maximum rated voltage and a third comparator for detecting a voltage close to zero voltage, and wherein the charging control means detects a fault, if any, according to signals from the second and third comparators, and controls charging.

* * * * *